United States Patent [19]
Geiger

[11] 3,947,724
[45] Mar. 30, 1976

[54] VARIABLE-FREQUENCY SWEEP GENERATOR CIRCUIT

[75] Inventor: Erich Geiger, Friesen, Germany

[73] Assignee: Loewe-Opta GmbH, Kronach, Germany

[22] Filed: Nov. 7, 1974

[21] Appl. No.: 521,661

[30] Foreign Application Priority Data
Nov. 9, 1973 Germany............................ 2356021

[52] U.S. Cl................................. 315/410; 315/408
[51] Int. Cl.² ........................................ H01J 29/74
[58] Field of Search ............ 315/339, 408, 409, 410; 331/108 A

[56] References Cited
UNITED STATES PATENTS
3,343,006   9/1967   Attwood.............................. 315/408

*Primary Examiner*—Maynard R. Wilbur
*Assistant Examiner*—T. M. Blum

[57] ABSTRACT

An improved sweep generator circuit suitable for deflection circuits in television receivers conventionally includes a condenser chargeable through a resistance to establish the sweep. A resistive voltage divider and a threshold comparator circuit are each arranged parallel to the condenser. The comparator circuit is triggerable to establish a low impedance discharge path across the condenser when the charging voltage across the condenser exceeds a normal reference voltage from the voltage divider. The frequency of the generator is made variable in response to a synchronization frequency within predetermined limits by shunting a resistance of the voltage divider by a control resistance through an electronic switch that is triggerable by the sync pulse train. Normally the minimum sync interval determines the heighest frequency of the sweep generator; if an additional (disturbance) pulse occurs within such minimum sync interval to prematurely establish the shunt connection of the control resistance, the condenser will not have had time to charge up to a value sufficient to reach the then-reduced reference voltage, and the comparator circuit will remain in its high impedance condition until the condenser voltage has attained a value equal to the normal reference voltage of the divider.

3 Claims, 3 Drawing Figures

VARIABLE-FREQUENCY SWEEP GENERATOR CIRCUIT

BACKGROUND OF THE INVENTION

Conventional self-oscillating sweep generators of the type used for deflection circuit applications in television receivers employ a condenser chargeable from a power supply over a resistance, and a voltage divider connected across the supply. A reference voltage derived from the output of the voltage divider is connected to one input of a normally disabled threshold comparator circuit constructed, e.g. from two complementary transistors. The voltage across the condenser is coupled to the other input of the comparator circuit. The comparator circuit is effectively disposed in shunt with the condenser so that when the reference voltage is exceeded by the condenser voltage during the charging thereof, a discharge path is provided for the condenser to terminate the sweep and immediately thereafter to restore the comparator circuit to its high impedance condition.

When such types of sweep generators are employed as vertical oscillators in T.V. receivers and the like, facilities must be provided for varying the frequency of the sweep to permit synchronization. In general, such variation of the frequency is accomplished by altering the resistance ratio of the voltage divider as the syncrate varies to correspondingly modify the reference voltage. This results in establishing the point during the sweep at which the capacitor-shunting comparator circuit is switched into its low impedance condition. One problem with conventional sweep generators of this type is that the above-mentioned changes in frequency can be effected not only by the normal repetitive sync pulses, but also by disturbance pulses occurring between successive sync pulses. When the sweep circuit responds to such disturbance pulses, the stability and/or size of the T.V. picture can be adversely affected.

SUMMARY OF THE INVENTION

This problem is solved by the improvments, in accordance with the invention, in this type of frequency-controlled sweep oscillator. The oscillator is provided with facilities for limiting the frequency variation to the range of normal variations in the sync repetition frequency so that the circuit is generally insensitive to interpolated disturbance pulses.

In an illustrative embodiment, an additional resistance is connected in shunt with one of the resistances of the voltage divider through the collector-emitter path of a transistor switch. The base of the transistor switch is connected to a suitable source of a train of synchronizing pulses, whose repetition rate may vary within normal tolerances (e.g. 8 Hz). for effecting a corresponding change in the frequency of the sweep generator. The magnitude of the additional resistance is chosen such that the reduction in amplitude of the reference voltage at the output of the voltage divider resulting from the switching in of the additional resistance by the synchronizing pulses applied to the transistor switch corresponds to the maximum permissible frequency (manifested, e.g., by the minimum possible sweep duration) exhibited by the sweep generator during normal triggered operation.

Thus, when the sync pulses are operating at their shortest repetition period, the normal triggering of the transistor switch will establish the reference voltage of the output of the voltage divider at such a value that it will be exceeded by the charging voltage of the capacitor at a time corresponding to the minimum permissible sweep duration of the oscillator. In the event that a pulse occurs which succeeds the preceding pulse by an interval shorter than such repetition period (i.e. upon the occurrence of a disturbance pulse interpolated between successive sync pulses), the triggering of the transistor switch will occur before the capacitor has charged to a value equal to the reduced reference voltage corresponding to such triggering, and thereby the comparator circuit will remain immune to such disturbance pulses.

BRIEF DESCRIPTION OF THE DRAWING

The invention is furthere set forth in the following detailed description taken in conjunction with the appended drawing, in which.

DETAILED DESCRIPTION

Figure 1:
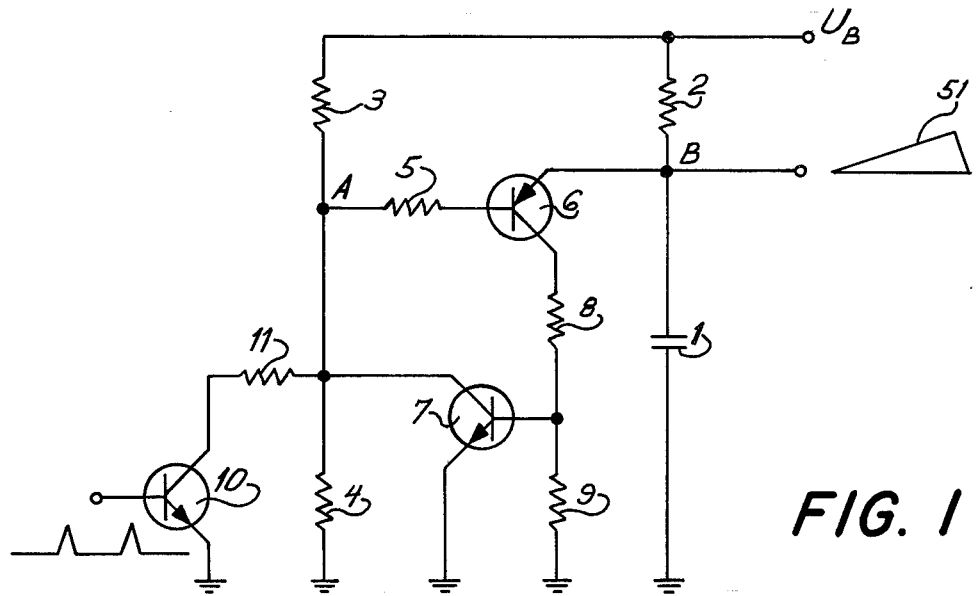
FIG. 1 is a schematic diagram of a variable-frequency sweep generator constructed in accordance with the invention.

Referring now to FIG. 1, a frequency-variable sweep generator is depicted wherein a condenser 1 is chargeable by means of a potential source $U_B$ connected to ground through a resistor 2. The charging operation of the condenser results in a linearly increasing voltage at a junction B between the resistor 2 and the condenser 1.

In order to discharge the condenser and thereby terminate the sweep during each cycle of the sweep wave form, a threshold comparator circuit consisting of a pair of complementary transistors 6 and 7 is connected across the condenser 1. The transistors 6 and 7 are normally in their high impedance condition so that the shunting effect of the comparator circuit on the condenser is normally negligible.

The sweep oscillator also includes a resistive voltage divider consisting of resistors 3 and 4 serially connected between the potential source $U_B$ and ground. The output of the divider, taken at a junction A of the resistors 3 and 4, is applied to the base of the transistor 6 through a base resistor 5. The voltage at the junction A represents a reference voltage which ultimately determins the sweep duration of the voltage at output point B and thereby the repetition frequency of the sweep generator. The collector of the transistor switch is coupled through a base resistance 8 to the base of the transistor 7 and to ground via an additional base resistance 9. The emitter of the transistor 7 is grounded. The collector of the transistor 7 is connected to the output point A of the voltage divider 3, 4.

The comparator circuit represented by the transistors 6 and 7 and the associated resistances is designed to be operable into a low impedance output state when the reference voltage at point A is exceeded by the voltage across the capacitor at point B. For this purpose, the point B is connected to the emitter of the transistor 6. Consequently, whenever the voltage at point B has charged up to a value that just exceeds the reference voltage at point A, the transistors 6 and 7 will be driven into conduction and the capacitor 1 will discharge via two paths to ground; (1) via the emitter-base path of transistor 6, resistance 5, and the collector-emitter path of the transistor 7, and (2) the emitter-collector path of transistor 6, the resistor 8, and the base-emitter path of the transistor 7. The discharge time constant of the capacitor 1 will in such circumstances be determined solely by the values of the base resistance 5 and 8, and will be relatively immune to variations in the amplification factors of the paired transistors 6 and 7.

The discharge of the capacitor 1 will rapidly proceed until the voltage at point B is no longer sufficient to maintain conduction in the transistors 6 and 7, at which point the comparator circuit will again revert to its open circuit state and a new cycle of the sweep will occur.

It is known that when sweep oscillators of the type just described are used in synchronized vertical oscillators for television receivers and the like, the repetition frequency of the sweep can be made to track variations in the repetition rate of the synchronizing pulses by altering the resistance ratio of the voltage divider 3, 4 and to correspondingly vary the reference voltage at point A. This is because the point of the sweep at which the comparator circuit will be operable into its low impedance state will vary with such changes in reference voltage. Unfortunately, in known circuits of this type the presence of disturbance pulses (i.e. pulses interpolated between the normally regularly occurring sync pulses in the pulse train) will indiscriminately cause corresponding frequency changes in the sweep circuit and will thereby effect an undesirable loss of synchronization of the television picture.

In accordance with the invention, this disadvantage is overcome by providing facilities that limit the change of frequency of the sweep circuit to a value that corresponds to the normally expected range of deviation of the synchronization pulses during normal television receiver operation, thereby effectively "locking out" the disturbance pulses of the above-mentioned type. In the illustrative embodiment of FIG. 1, this is accomplished by shunting the lower resistance 4 of the voltage divider by an additional resistance 11 which is coupled to ground via the collector-emitter path of a normally disabled switching transistor 10. The base of the transistor 10 is coupled to the conventional source of sync pulses whose repetition rate is variable within prescribed limits (e.g. 8 Hz.) of a normal television receiver. The switching transistor 10 is adapted to be switched into conduction momentarily upon the occurrence of each synchronizing pulse in the train, and to revert to its open circuit state immediately thereafter.

The value of the resistance 11 is chosen such that when the pulse repetition period of the pulses applied to the base of the transistor 10 is at its minimum permissible value, the corresponding reduction in the reference voltage at point A will be sufficient to reduce the sweep duration represented by curve 51 (FIG. 3) from an outer limit represented at 53 to an immer limit represented at 54. The range between the points 53 and 54 will thus represent the maximum permissible deviation in the sweep repetition frequency during normal television receiver operation. Thus, the reference voltage at point A will vary between a value $U_{max}$, corresponding to point 53, and $U_{min}$, corresponding to the point 54, over the permissible range of sync repetition period variation.

With this arrangement, any further reduction in the interval between successive pulses of the train applied to the base of the switching transistor 10 will cause the voltage at point A to be momentarily reduced from the value $U_{max}$ to the value $U_{min}$ before be charging voltage across the condenser 1 has reached the value $U_{min}$. Consequently, the threshold comparator circuit consisting of the transistors 6, 7 will not be triggered into conduction until the sweep curve 51 has run its full cource (i.e., up to its normal outer limit 53). Since the reduction in interval of the pulses is normally indicative of the presence of a disturbance pulse between the normally regularly recurring sync pulses, it will be evident that the inventive arrangement is effective to insulate the sweep oscillator from the normally deleterious effects of disturbance pulses of this type.

An additional advantage of the inventive arrangement is that even though the point 53 to which the sweep is driven in the presence of disturbance impulses may be slightly different from the value within the range between the points 53–54 dictated by the instantaneous synchronization frequency, such exact point is recoverable within at most several oscillations at the sync rate following the disappearance of the disturbance pulse.

Figures 2, 3:
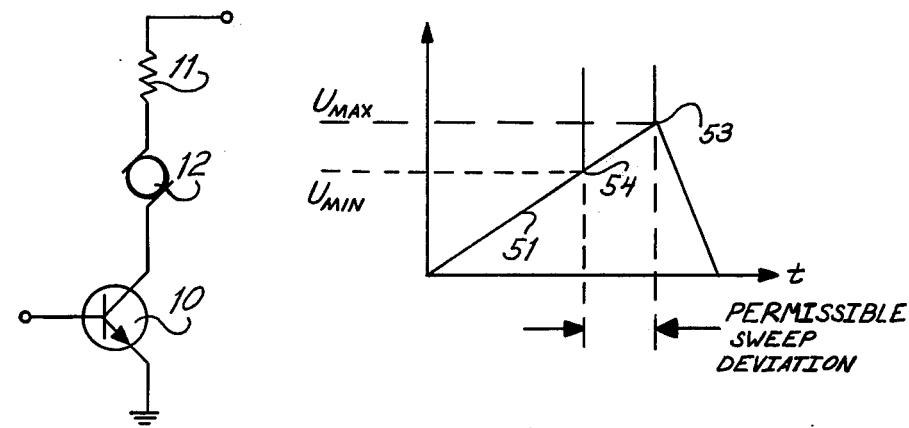
FIG. 2 is a schematic diagram of a modified portion of the frequency-changing portion of FIG. 1.
FIG. 3 is a curve showing one cycle of a typical sweep wave form generated by the circuit of FIG. 3, together with a representation of the range within which the sweep duration and thereby the sweep frequency can be regulated in accordance with the invention.

A modification of the arrangement to FIG. 1 is shown in FIG. 2. In this arrangement, in which corresponding elements in FIGS. 1 and 2 have been given corresponding reference numerals, a current source 12 is serially connected with the switching transistor 10 and the resistor 11. The function of the current generator 12 is to alter the collector characteristics of the transistor 10 during the time that the latter is switched into conduction and thereby effect a variation in the reference voltage A and thereby in the frequency of the sweep oscillator even in the absence of changes in the repetition rate of the synchronization pulses. Such application is useful, for example, when the sweep oscillator is employed as a vertical oscillator in a TV receiver.

Within the constraints imposed above, the resistor 11 may be given any desired value. Conveniently, the value of the resistor 11 may be made equal to that of the resistor 4 of the voltage divider 3,4, whereupon the value $U_{min}$ (FIG. 3) will be somewhat less than one half the value of $U_{max}$.

In the foregoing, the invention has been described in connection with preferred arrangements thereof. Many variations and modifications will now occur to those skilled in the art. It is accordingly desired that the scope of the appended claims not be limited to the specific disclosure hereincontained.

What is claimed is:

1. In a variable frequency sweep circuit having a condenser changeable through a resistance whereby the voltage across the condenser establishes the sweep, a voltage divider including at least first and second resistances, the divider generating at its output a reference voltage determined by the ratio of the resistances, a normally disabled comparator circuit having first and second inputs and an output connected across the condenser, the output of the comparator circuit normally exhibiting a high output impedance when the voltage at its first input exceeds the voltage at its second input, the comparator circuit being triggerable to a low output impedance when the voltage at its second input exceeds the voltage at its first input to terminate the sweep, means for coupling the reference voltage to the first input of the comparator circuit and means for coupling the voltage across the condenser to the second input of the comparator circuit, an improved arrangement for adjusting the frequency of the sweep generator which comprises, in combination, a third resistance, a normally disabled electronic switch having a trigger electrode and a transconductive path, means for serially coupling the transconductive path of the switch and the third resistance across the second resistance of the voltage divider, and means for coupling the trigger electrode of the switch to a normally regularly repetitive train of trigger pulses to shunt the third resistance across the second resistance only during the occurrence of a trigger pulse, said third resistance being so chosen that the reference voltage existing at the output of the voltage divider during the momentary shunting of the second resistance by the third resistance is a prescribed fraction of the maximum reference voltage to establish a correspondingly prescribed time interval within the sweep at which the comparator circuit is operable to its low output impedance condition.

2. A sweep circuit as defined in claim 1, in which the magnitudes of the second and third resistances are substantially equal.

3. A sawtooth circuit according to claim 1, further comprising a current generator connected in series with the switch and the third resistance.

* * * * *